United States Patent
Yi et al.

(10) Patent No.: US 10,062,733 B1
(45) Date of Patent: Aug. 28, 2018

(54) INTEGRATED CIRCUITS WITH MAGNETIC TUNNEL JUNCTION MEMORY CELLS AND METHODS FOR PRODUCING THE SAME

(71) Applicant: Globalfoundries Singapore Pte. Ltd., Singapore (SG)

(72) Inventors: Wanbing Yi, Singapore (SG); Curtis Chun-I Hsieh, Singapore (SG); Mahesh Bhatkar, Singapore (SG); Hui Liu, Singapore (SG); Chin Chuan Neo, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/609,114

(22) Filed: May 31, 2017

(51) Int. Cl.
| | | |
|---|---|---|
| *H01L 21/768* | (2006.01) | |
| *H01L 27/22* | (2006.01) | |
| *H01L 43/08* | (2006.01) | |
| *H01L 43/02* | (2006.01) | |
| *H01L 43/12* | (2006.01) | |

(52) U.S. Cl.
CPC .......... *H01L 27/222* (2013.01); *H01L 43/02* (2013.01); *H01L 43/08* (2013.01); *H01L 43/12* (2013.01)

(58) Field of Classification Search
CPC .................... H01L 27/222; H01L 21/76829
See application file for complete search history.

(56) References Cited

U.S. PATENT DOCUMENTS

| 9,349,772 | B2 | 5/2016 | Yi et al. | |
|---|---|---|---|---|
| 9,490,423 | B2 | 11/2016 | Tan et al. | |
| 2011/0101538 | A1* | 5/2011 | Ponoth | H01L 21/76816 257/774 |
| 2016/0351797 | A1* | 12/2016 | Yi | H01L 27/228 |

* cited by examiner

*Primary Examiner* — Thomas L Dickey
(74) *Attorney, Agent, or Firm* — Lorenz & Kopf, LLP

(57) ABSTRACT

Integrated circuits and methods of producing the same are provided. In an exemplary embodiment, a method for producing an integrated circuit includes forming a memory cell with a memory cell upper surface. A capping layer is formed overlying the memory cell, and a portion of the capping layer is removed to expose the memory cell upper surface. A memory cell etch stop is formed overlying the memory cell upper surface after the portion of the capping layer is removed to expose the memory cell upper surface. The memory cell etch stop is removed from overlying the memory cell upper surface, and an interconnect is formed in electrical communication with the memory cell.

16 Claims, 5 Drawing Sheets

INTEGRATED CIRCUITS WITH MAGNETIC TUNNEL JUNCTION MEMORY CELLS AND METHODS FOR PRODUCING THE SAME

TECHNICAL FIELD

The technical field generally relates to integrated circuits with magnetic tunnel junction memory cells, and methods of producing the same. More particularly, the technical field relates to integrated circuits with magnetic tunnel junction memory cells having upper interconnects accurately positioned at a memory cell upper surface, and methods of producing the same.

BACKGROUND

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though conventional non-volatile RAM is typically slower than volatile RAM, MRAM has read and write response times that are comparable to that of volatile RAM. Unlike typical RAM technologies that store data as electric charges, MRAM data is stored by magnetoresistive elements. Generally, the magnetoresistive elements are made from two magnetic layers, each of which holds a magnetic orientation. The magnetization of one layer (the "pinned layer") is fixed in its magnetic orientation, and the magnetization of the other layer (the "free layer") can be changed by an external magnetic field generated by a programming current. The pinned and free layers are separated by a tunnel barrier layer. The magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

The size of components in integrated circuits is becoming smaller and smaller over time. MRAM cells are relatively small, and the size of the MRAM cell will most likely be further reduced in the future. For example, the top layer may be about 40 nanometers (nm) thick or less in some embodiments. The pinned layer, the free layer, and/or the tunnel barrier layer include sub-layers in many embodiments, so the sub-layers are even smaller. The formation of the electrical connection to the top of the MRAM cell includes forming a dielectric layer over the MRAM cell, smoothing the surface of that dielectric layer with chemical mechanical planarization (CMP), etching a via through the dielectric layer, and then forming a conductive "interconnect" within the open via. The process variation in the CMP and etching process is more than the 40 nm size of the top layer in some embodiments. As a result, the interconnect extending to the top layer of the MRAM cell is not long enough in some cases such that a portion of the dielectric remains between the interconnect and the MRAM cell and the circuit is permanently blocked open. In other instances, the interconnect is too long and passes through the top layer of the MRAM cell so the MRAM cell is permanently shorted.

Accordingly, it is desirable to provide integrated circuits and methods of producing such integrated circuits with MRAM cells and interconnects where the interconnect reliably forms an electrical connection with the MRAM cell without shorting the MRAM cell. In addition, it is desirable to provide integrated circuits and methods of producing integrated circuits that include a higher percentage of properly function MRAM cells (i.e. MRAM cells that are not permanently open or shorted), compared to traditional integrated circuits with MRAM cells. Furthermore, other desirable features and characteristics of the present embodiment will become apparent from the subsequent detailed description and the appended claims, taken in conjunction with the accompanying drawings and this background.

BRIEF SUMMARY

Integrated circuits and methods of producing the same are provided. In an exemplary embodiment, a method for producing an integrated circuit includes forming a memory cell with a memory cell upper surface. A capping layer is formed overlying the memory cell, and a portion of the capping layer is removed to expose the memory cell upper surface. A memory cell etch stop is formed overlying the memory cell upper surface after the portion of the capping layer is removed. The memory cell etch stop is removed from overlying the memory cell upper surface, and an interconnect is formed in electrical communication with the memory cell.

In another embodiment, a method of producing an integrated circuit is provided. The method includes forming a memory cell with a memory cell upper surface, and forming a memory cell etch stop overlying the memory cell. A memory dielectric layer is formed overlying the memory cell etch stop, and a via is formed in the memory dielectric layer such that the memory cell etch stop is exposed in the via. At least a portion of the memory cell etch stop is removed from within the via, and an interconnect is formed in electrical communication with the memory cell.

An integrated circuit is provided in yet another embodiment. The integrated circuit includes a memory cell and a capping layer directly contacting the memory cell. The integrated circuit includes a covering layer, where the capping layer is between the covering layer and the memory cell, and the integrated circuit also includes a memory cell etch stop. The capping layer and the covering layer are both positioned between the memory cell etch stop and the memory cell. An interconnect is in electrical communication with the memory cell.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. In particular, this description focuses on MRAM cell production using a memory cell etch stop layer over the MRAM cell to facilitate accurate connection of the MRAM cell to an overlying interconnect. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
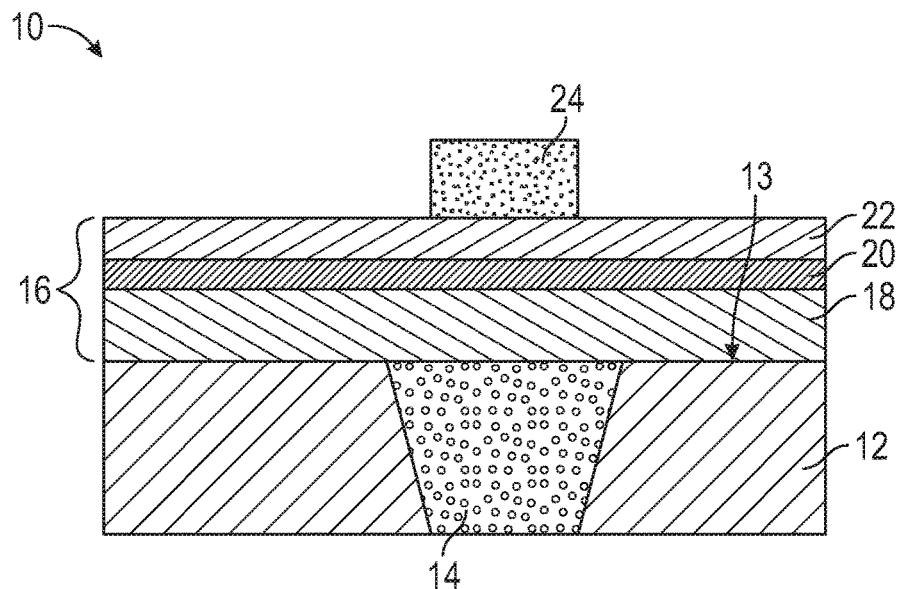
FIGS. 1-10 illustrate, in cross sectional views, an integrated circuit and methods for producing the same in accordance with exemplary embodiments.

Referring to an exemplary embodiment illustrated in FIG. 1, the integrated circuit 10 includes an interlayer dielectric 12 with a base interconnect 14 positioned within the interlayer dielectric 12. The interlayer dielectric 12 is an electrical insulator, and the base interconnect 14 is an electrical conductor. As used herein, an "electrically insulating material" or an "electrical insulator" is a material with a resistivity of about $1 \times 10^4$ ohm meters or more, an "electrically conductive material" or an "electrical conductor" is a material with a resistivity of about $1 \times 10^{-4}$ ohm meters or less, and an "electrically semiconductive material" or an "electrical semiconductor" is a material with a resistivity of from about more than $1 \times 10^{-4}$ ohm meters to less than about $1 \times 10^4$ ohm meters. The interlayer dielectric 12 may be formed of one or more low-k dielectric materials, un-doped silicate glass (USG), silicon nitride, silicon oxynitride, or other commonly used materials. The interlayer dielectric 12 may be formed using conventional deposition techniques, which depend on the particular material employed. In an exemplary embodiment, the interlayer dielectric 12 includes silicon dioxide and may be formed by a chemical vapor deposition process using tetraethyl orthosilicate (TEOS) as a reactant, but other techniques or materials can be used in alternate embodiments. As referred to herein, a material that includes a recited element/compound includes the recited element/compound in an amount of at least about 1 weight percent or more based on the total weight of the material unless otherwise indicated.

The interlayer dielectric 12 includes an interlayer dielectric upper surface 13. The interlayer dielectric upper surface 13 may be used as a reference for various components described herein. A "horizontal" direction for the integrated circuit 10 generally refers to a plane that is parallel to the interlayer dielectric upper surface 13, and a "vertical" direction is perpendicular to the interlayer dielectric upper surface 13.

The base interconnect 14 includes copper in an exemplary embodiment, but other conductive metals or materials may be used in alternate embodiments, such as tantalum, tantalum nitride, or combinations thereof. In an exemplary embodiment where the base interconnect 14 includes copper, a liner and core are formed (not individually illustrated). In an exemplary embodiment, the liner is formed of copper and manganese deposited by physical vapor deposition using copper amidinate and manganese amidinate, and the core is deposited by copper electroplating followed by chemical mechanical planarization to remove the overburden.

In many embodiments, the integrated circuit 10 includes a substrate (not illustrated) underlying the interlayer dielectric 12. The substrate is typically formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. One or more electronic component (not illustrated) are typically formed on and/or within the substrate or in other locations within the integrated circuit 10, such as transistors, capacitors, resistors, diodes, etc. Conventional interconnects are also included to provide electrical signal transport, where interconnects are formed of conductive materials such as copper, aluminum, or other materials.

A magnetic tunnel junction (MTJ) stack layer 16 is formed overlying the interlayer dielectric 12 and the base interconnect 14. As used herein, the term "overlying" means "over" such that an intervening layer may lie between the overlying component (the MTJ stack layer 16 in this example) and the underlying component (the interlayer dielectric 12 in this example,) or "on" such that the overlying component physically contacts the underlying component. The MTJ stack layer 16 includes a plurality of individual material layers. In one embodiment, the MTJ stack layer 16 includes a free layer 18 overlying the base interconnect 14 and the interlayer dielectric 12, a tunnel barrier layer 20 overlying the free layer 18, and a pinning layer 22 overlying the tunnel barrier layer 20. Each of the free layer 18, the tunnel barrier layer 20, and/or the pinning layer 22 may include sublayers (not individually illustrated) in various embodiments. Although not illustrated, the free layer 18 and the pinning layer 22 are reversed in alternate embodiments, where the free layer 18 overlies the tunnel barrier layer 20 and the pinning layer 22 underlies the tunnel barrier layer 20, but the tunnel barrier layer 20 is always positioned between the free and pinning layers 18, 22. In some embodiments the tunnel barrier layer 20 is thin, such as from about 1 to about 2 nm in thickness, and is an electrical insulator. The tunnel barrier layer 20 includes magnesium oxide in an exemplary embodiment, but the tunnel barrier layer 20 may include silicon dioxide or other electrical insulating materials in alternate embodiments. The tunnel barrier layer 20 may be deposited by sputtering magnesium followed by plasma oxidation, but other deposition techniques are also possible.

The free layer 18 includes cobalt iron boron (CoFeB) and the pinning layer 22 includes platinum manganese (PtMn) in one embodiment. However, in other embodiments the free layer 18 and/or the pinning layer 22 include other materials such as iridium manganese (IrMn), nickel manganese (NiMn), iron manganese (FeMn), CoFeB, or other materials. The free and pinning layers 18, 22 may be formed by ion beam sputtering, but other techniques can be used in alternate embodiments. The pinning layer 22 and the free layer 18 include magnetic materials and are magnetic, and the tunnel barrier layer 20 is non-magnetic. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field.

The pinning layer 22 is typically a fixed magnet, and the magnetic orientation of the free layer 18 is changed relative to the magnetic orientation of the pinning layer 22 to change the resistance of the MTJ stack layer 16. The change in resistance of the MTJ stack layer 16 serves as memory for the integrated circuit 10, as mentioned above. The free layer 18 is in electrical communication with the base interconnect 14 in the illustrated embodiment, and may be in direct electrical contact with the base interconnect 14 is some embodiments. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating materials. An etch mask layer (not illustrated) is formed overlying the upper portion of the MTJ stack layer 16, which is the pinning layer 22 in the illustrated embodiment, where the etch mask layer may be tantalum nitride or other materials that aid in etch selectivity.

An MTJ photoresist layer 24 is formed and patterned overlying the MTJ stack layer 16. The MTJ photoresist layer 24 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the MTJ photoresist layer 24 remains overlying the other areas of the MTJ stack layer 16. The MTJ photoresist layer 24 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane. The MTJ photoresist layer 24 (and other photoresist layers described below) is removed after use, such as with an oxygen containing plasma.

Figure 2:
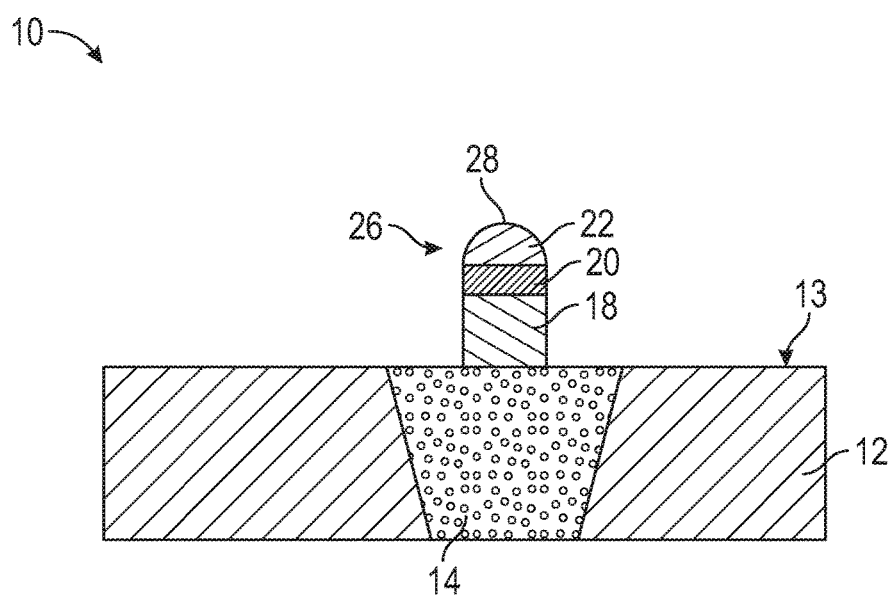

Referring to FIG. 2, with continuing reference to FIG. 1, a memory cell 26 (illustrated in FIG. 2) is formed from the MTJ stack layer 16 (illustrated in FIG. 1). The MTJ stack layer 16 is etched in the exposed area to produce the memory cell 26 in the area(s) protected by the MTJ photoresist layer 24 and/or any associated masks. The MTJ stack layer 16 is etched anisotropically, such as with a plasma dry etch using an inert gas such as argon, to produce the memory cell 26. The memory cell 26 includes a memory cell upper surface 28 that is illustrated with a rounded shape, because the etching process tends to remove the edges of memory cell 26, particularly the etch mask layer (not illustrated) overlying the memory cell 26 as mentioned above as well the top portion of the pinning layer 22 near the memory cell upper surface 28 in the illustrated embodiment. However, the rounded shape of the memory cell upper surface 28 is not critical and other shapes are possible in alternate embodiments. The memory cell 26 includes portions of the free layer 18, the tunnel barrier layer 20, and the pinning layer 22 from the MTJ stack layer 16.

Figure 3:
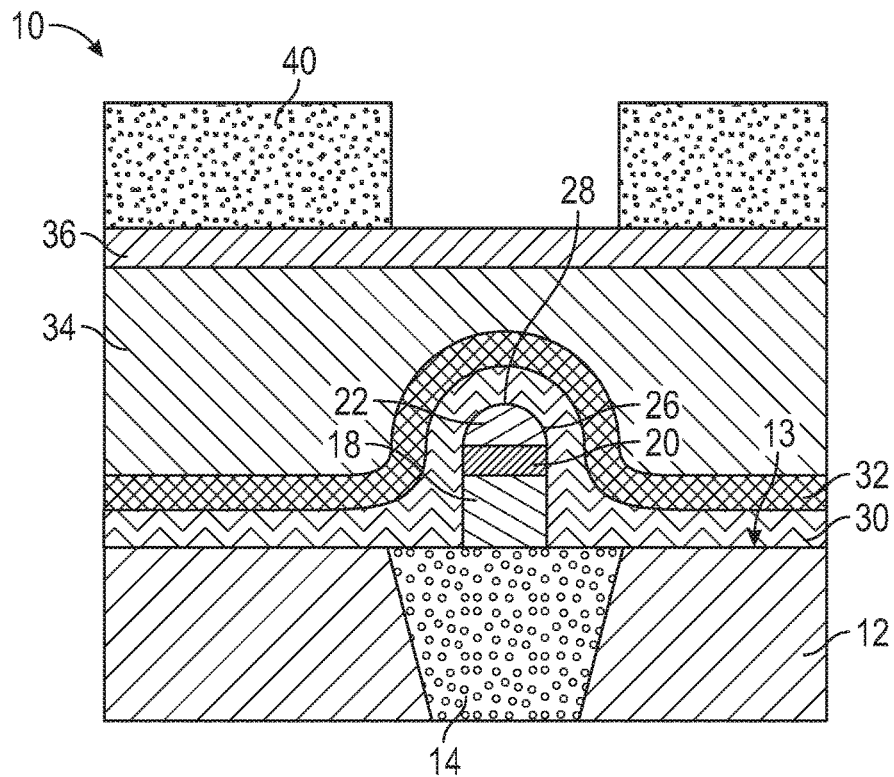

A capping layer 30 is formed overlying the memory cell 26 and the interlayer dielectric 12, as illustrated in an exemplary embodiment in FIG. 3. The capping layer 30 is an electrical insulator, so the capping layer 30 covers and insulates the memory cell 26. In an exemplary embodiment, the capping layer 30 primarily includes silicon nitride, which can be deposited by low pressure chemical vapor deposition using ammonia and dichlorosilane. However, other deposition techniques and/or materials are used in alternate embodiments. As used herein a component "primarily" includes an element or compound if that component is more than about 50 weight percent of that element or compound based on the entire weight of the component. In some embodiments, the capping layer 30 directly contacts the memory cell 26.

With continued reference to FIG. 3, a covering layer 32 is then formed overlying and covering the capping layer 30, where the covering layer 32 is also an electrical insulator. Therefore, the capping layer 30 is between the covering layer 32 and the memory cell 26. In an exemplary embodiment, the covering layer 32 primarily includes silicon dioxide, which can be formed by chemical vapor deposition using silane and oxygen, but other deposition techniques or materials are used in alternate embodiments. A sacrificial layer 34 is then formed overlying the covering and capping layers 32, 30, where the sacrificial layer 34 provides a relatively level surface for patterning. In an exemplary embodiment, the sacrificial layer is an organic material that may be free of nitrogen. The term "free of nitrogen," as used herein, means nitrogen is not detectable employing conventional testing equipment, such as atomic adsorption spectroscopy. Nitrogen free organic compounds are commercially available, and may be based on various chemistry, such as fullerene compounds or compounds with aryl groups having hydroxyl and/or carboxylic functional groups.

An optional seal layer 36 is then formed overlying the sacrificial layer 34 in an exemplary embodiment. The seal layer 36 may include low temperature silicon dioxide, but other materials are used in alternate embodiments. A covering photoresist layer 40 is formed and patterned overlying the sacrificial layer 34 and the optional seal layer 36. The covering photoresist layer 40 is patterned to expose the area directly over the memory cell 26.

Figure 4:
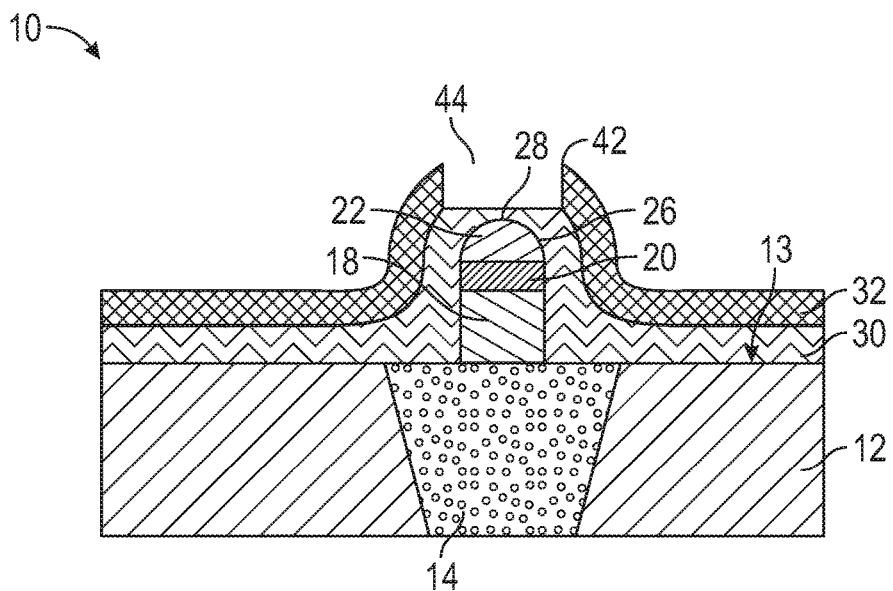

Reference is made to an exemplary embodiment illustrated in FIG. 4, with continuing reference to FIG. 3. The seal layer 36, the sacrificial layer 34, and the covering layer 32 directly over the memory cell 26 are removed by an anisotropic etch following the pattern from the covering photoresist layer 40. The etch may also remove a portion of the capping layer 30 over the memory cell upper surface 28. A wide variety of etchants may be used in various embodiments, such as a reactive ion etch with difluoromethane. The covering photoresist layer 40 and the optional seal layer 36 are removed after the covering layer 32 directly overlying the memory cell 26 is etched. The covering photoresist layer 40 may be removed with an oxygen containing plasma, and the seal layer 36 may be removed with a wet etch using dilute hydrofluoric acid. The remaining sacrificial layer 34 may be removed with an oxygen containing plasma. The covering layer 32 may form a "peak" 42 at the edge of where the covering layer 32 was removed due to etch dynamics, so the covering layer 32 may include two peaks 42 adjacent to a gap 44 in the covering layer 32 that directly overlies the memory cell upper surface 28.

Figure 5:
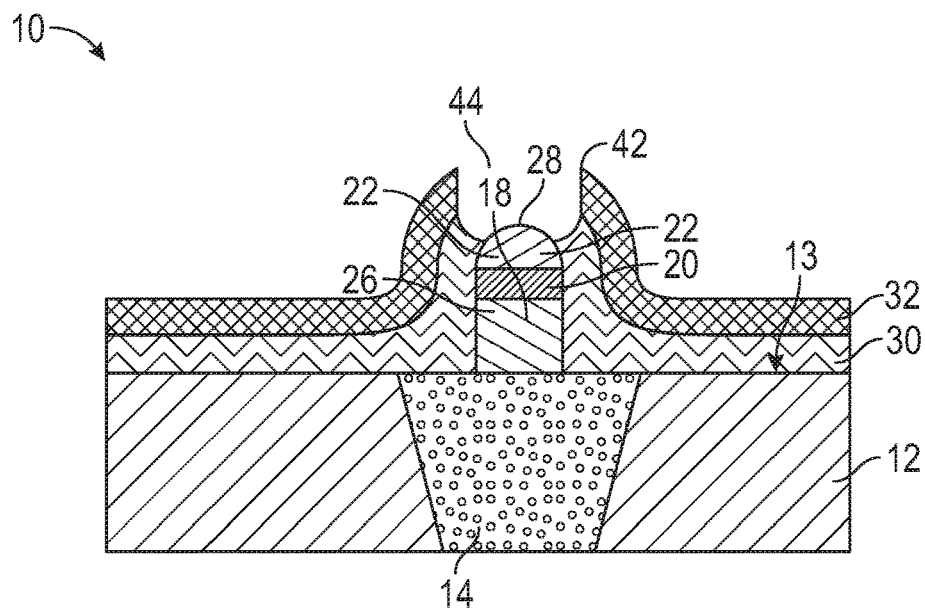

The capping layer 30 that directly overlies the memory cell upper surface 28 is removed, as illustrated in an embodiment in FIG. 5. The capping layer 30 and the covering layer 32 have different compositions with different etch rates for selected etchants, so the capping layer 30 may be removed much more rapidly than the covering layer 32 based on the selection of the etchant. The exposed portion of the capping layer 30, which is the portion of the capping layer 30 overlying the memory cell upper surface 28 that is not covered by the covering layer 32, may be removed with a wet etch using hot phosphoric acid in embodiments where the capping layer 30 primarily includes silicon nitride. The depth of removal of the capping layer 30 may be controlled by timing the exposure of the integrated circuit 10 to the etchant. In an alternate embodiment, the exposed portion of the capping layer 30 is removed with a blanket plasma dry etch for a fixed time period. The blanket plasma dry etch, if used, will remove some of the covering layer 32 as well.

Figure 6:
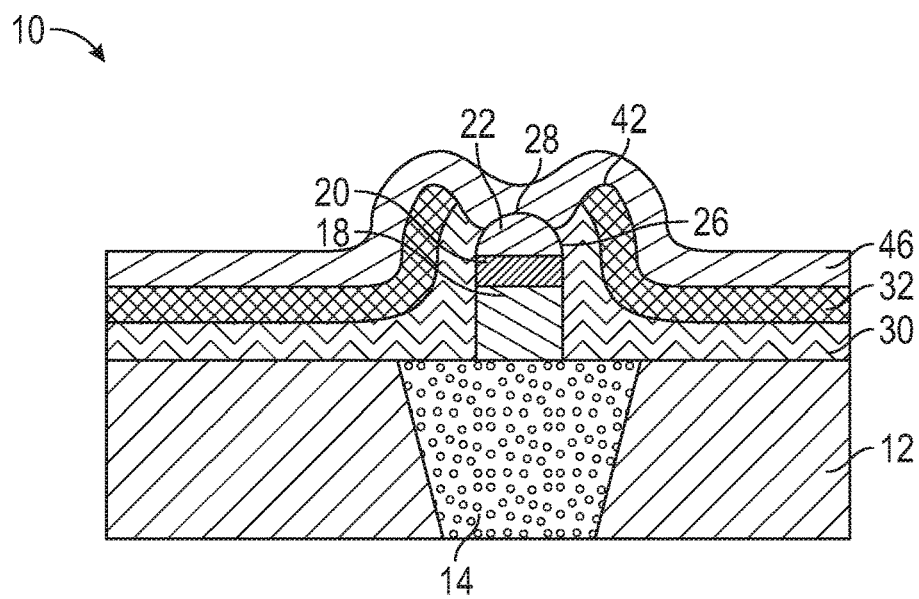

FIG. 6 illustrates an embodiment where a memory cell etch stop 46 is formed overlying the memory cell upper surface 28 and the remaining portions of the capping layer 30 and the covering layer 32. As such, the capping layer 30 and covering layer 32 are disposed between the memory cell etch stop 46 and the memory cell 26 along a side surface of the memory cell 26. The memory cell etch stop 46 includes silicon nitride in an exemplary embodiment, which may be formed as described above, so the memory cell etch stop 46 and the capping layer 30 may primarily include the same material (such as silicon nitride) in some embodiments. In some embodiments, the memory cell etch stop 46 primarily includes silicon nitride. The memory cell etch stop 46 is in direct contact with the memory cell 26 at the memory cell upper surface 28 in some embodiments. Deposition of the memory cell etch stop 46 may include some bombardment of the underlying surfaces such that the peak 42 of the covering layer 32 is somewhat dulled, but the peak 42 remains. The memory cell etch stop 46 forms a "dish" shape overlying the memory cell 26, where the peaks 42 from the covering layer 32 are high points at the edge of the dish shape and the area overlying the memory cell 26 is the low point. The dish shape of the memory cell etch stop 46 is a convex shape overlying the memory cell 26, where the convex shape is convex relative to the memory cell upper surface 28. This convex shape also provides an area near the edge of the gap 44 in the covering layer 32 where the memory cell etch stop 46 is thicker because of the curved, convex shape. This thicker portion of the memory cell etch stop 46 is thicker in a vertical direction that is about perpendicular to the interlayer dielectric upper surface 13. In other words, the convex shape of the memory cell etch stop 46 forms a spacer along the edge of the peak 42.

Figure 7:
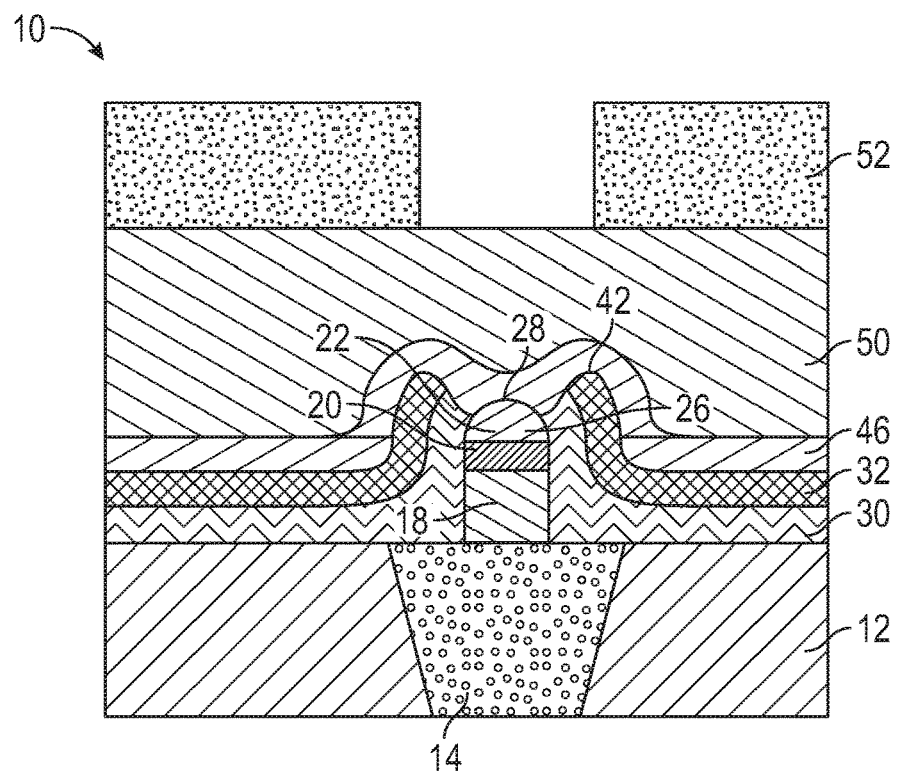
Figure 8:
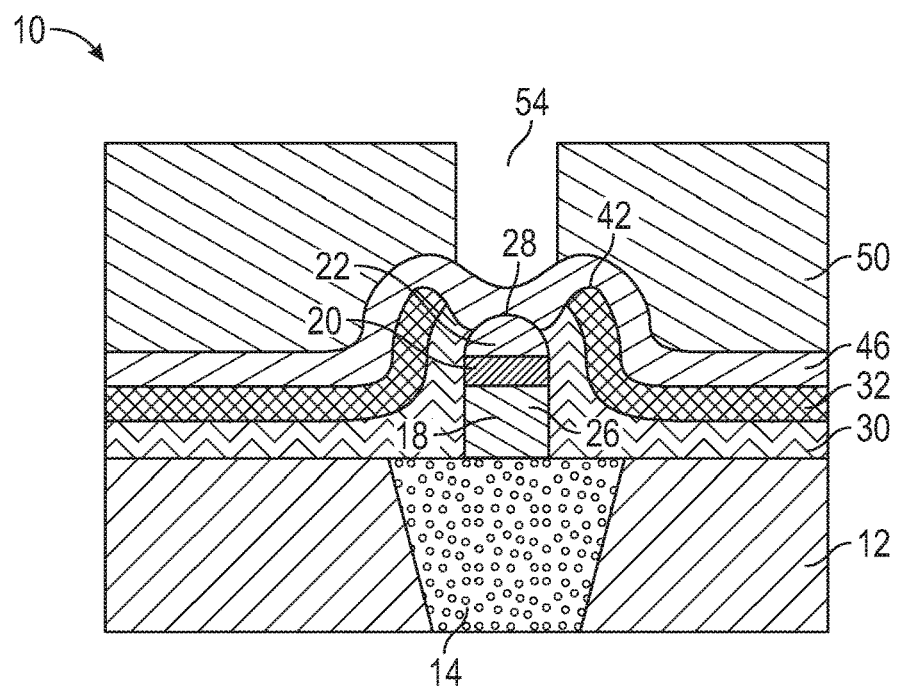

Referring to an embodiment in FIG. 7, a memory dielectric layer 50 is formed overlying the memory cell etch stop 46. The memory dielectric layer 50 is an electrical insulator, and may be a wide variety of materials as described for the interlayer dielectric above. In an exemplary embodiment, the memory dielectric layer 50 includes silicon dioxide. An upper surface of the memory dielectric layer 50 is smoothed in some embodiments, such as with chemical mechanical planarization. A via photoresist layer 52 is formed and patterned overlying the memory dielectric layer 50, where the via photoresist layer 52 is patterned to expose the memory dielectric layer 50 directly overlying the memory cell 26. A via 54 is then formed in the memory dielectric layer 50 using the via photoresist layer 52 for the pattern, as illustrated in FIG. 8 with continuing reference to FIG. 7. The via 54 is about centered on the memory cell, and an etchant that is selective to the material of the memory dielectric layer 50 over the material of the memory cell etch stop 46 is used such that the via terminates at the surface of the memory cell etch stop 46. As such, the memory cell etch stop 46 is exposed in the via 54. In an exemplary embodiment, the via 54 is formed through the memory dielectric layer 50 with a reactive ion etch using argon, nitrogen, and carbon fluorides, but other etchants are used in alternate embodiments.

Figure 9:
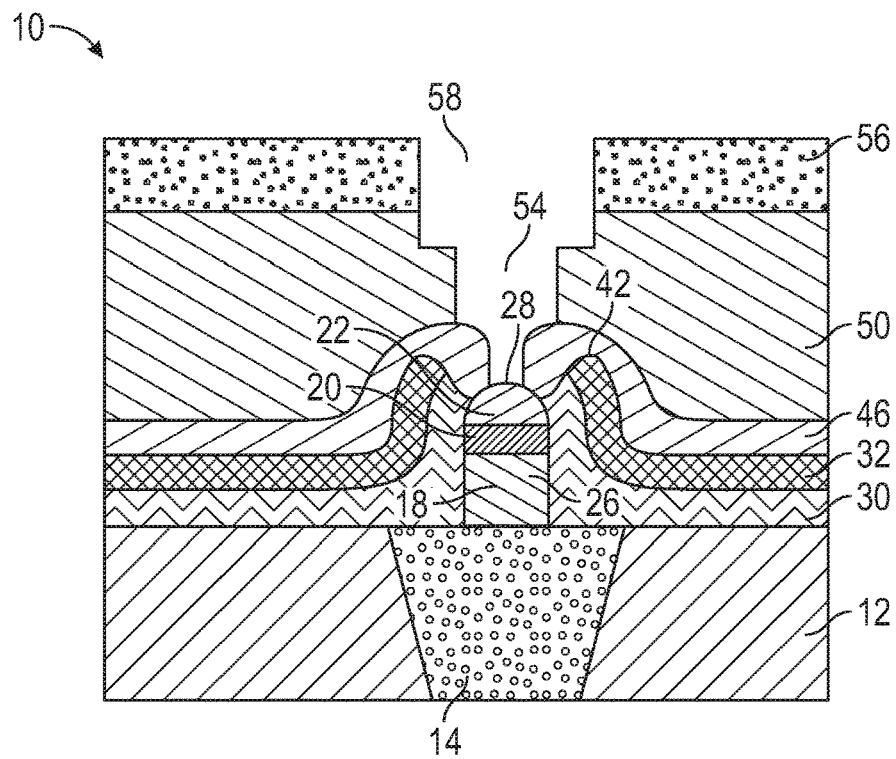

Reference is made to an embodiment in FIG. 9, with continuing reference to FIG. 8. An organic material (not illustrated) may be deposited on the integrated circuit 10, where the organic material fills the via 54. The organic material may be a carbon-based polymeric material, and may be deposited as a polymer or as monomers that are then polymerized in various embodiments. A trench photoresist layer 56 is formed and patterned overlying the via 54, where a low temperature silicon dioxide layer (not illustrated) may be formed underlying the trench photoresist layer 56 in some embodiments. A trench 58 is then formed overlying the via 54, where the trench 58 replaces an upper portion of the via 54. The trench 58 is formed with one or more etches in various embodiments. In an exemplary embodiment, the trench 58 is formed using a low temperature oxide etch for the optional low temperature oxide layer (not illustrated,) if present, followed by a plasma dry etch to remove the organic material and an exposed portion of the memory dielectric layer 50 to form the trench 58.

At least a portion of the memory cell etch stop 46 is then removed from within the via 54 to expose the memory cell upper surface 28, such as with a wet etch using hot phosphoric acid. However, other etch techniques are used in alternate embodiments. The etch of the memory cell etch stop 46 is terminated such that a portion of the memory cell etch stop 46 remains, where the remaining portion is typically a vertical portion resulting from the convex shape of the memory cell etch stop 46 overlying the memory cell 26. This remaining portion acts as a spacer that protects the edges of the covering layer 32 and the capping layer 30 from the etching process at a sidewall of the memory cell 26. As such, the capping layer 30 (and the covering layer 32) remain in place, so the memory cell upper surface 28 is accurately exposed without removing excessive portions of the top layer of the memory cell (the pinning layer 22 in the illustrated embodiment.) The via 54 and trench 58 may be formed simultaneously with a via and trench (not illustrated) in a logic area for a dual damascene process, and the technique for forming the via 54 is adjusted to utilize the same etches that are used for the via or trench in the logic area in some embodiments. In alternate embodiments, the via 54 is skipped in the memory area, or the area of the integrated circuit 10 that includes the memory cell 26, and the memory cell upper surface 28 is exposed using the trench 58 without the use of the via 54.

Figure 10:
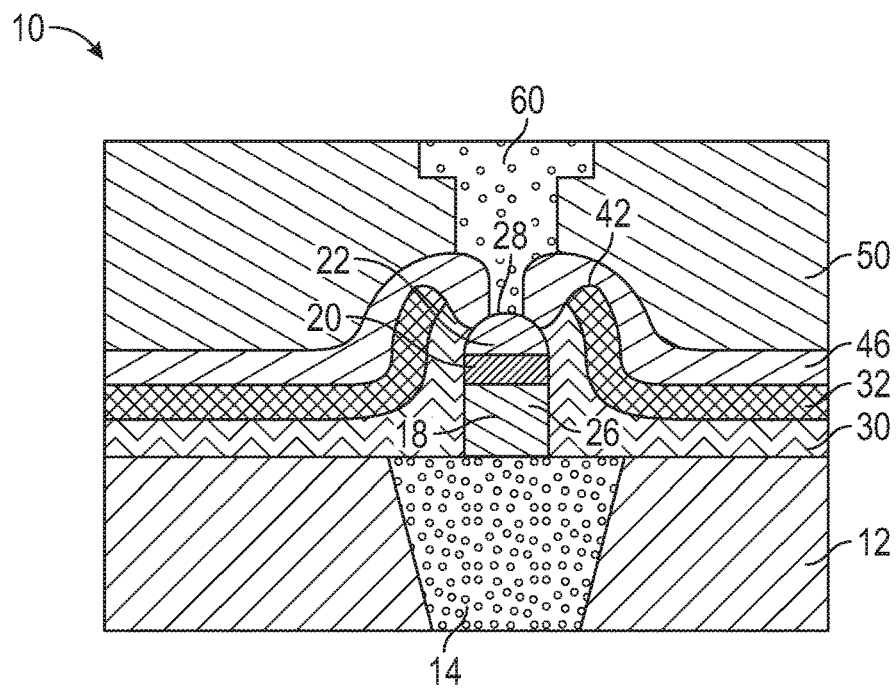

A cover interconnect 60 is formed within the via 54 and the trench 58, as illustrated in an embodiment in FIG. 10 with continuing reference to FIG. 9. The cover interconnect 60 is formed of an electrically conductive material, and the cover interconnect 60 is in electrical communication with the memory cell 26. In an exemplary embodiment, the cover interconnect 60 is in direct electrical contact with the memory cell 26 at the memory cell upper surface 28. In an exemplary embodiment, the cover interconnect 60 includes an adhesion layer, a barrier layer, and a plug (not individually illustrated), which are sequentially deposited. For example, an adhesion layer of tantalum nitride is formed by physical vapor deposition, a barrier layer of tantalum is formed by physical vapor deposition, and a plug of copper is formed by electrochemical plating. Other types of interconnects are also possible, such as tungsten or other conductive materials. The memory cell 26 is in electrical communication with the cover interconnect 60 on top and the base interconnect 14 on the bottom. The cover interconnect 60 and the base interconnect 14 are utilized to incorporate the memory cell 26 into the integrated circuit 10.

The techniques described above produce an accurate via 54 the terminates at the memory cell upper surface 28, but does not terminate within the memory dielectric layer 50 or within the memory cell 26. The convex shape of the memory cell etch stop 46 and the resulting spacers protect the capping and covering layers 30, 32 at the edge or sidewall of the memory cell 26. As a result, the opening 44 illustrated in FIGS. 4 and 5 retains the dimensions as originally formed during the formation of the via 54 and the trench 58, and this helps reduce over-etching and shorting of the memory cell 26. This reduces the chance of forming a short or an open memory cell 26 when the cover interconnect 60 is formed, as described above.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming a memory cell, wherein the memory cell comprises a memory cell upper surface;
    forming a capping layer overlying the memory cell;
    removing a portion of the capping layer to expose the memory cell upper surface
    forming a memory cell etch stop overlying the memory cell upper surface after removing the portion of the capping layer;
    removing the memory cell etch stop from overlying the memory cell upper surface; and
    forming an interconnect in electrical communication with the memory cell.

2. The method of claim 1 wherein forming the capping layer comprises forming the capping layer wherein the capping layer primarily includes silicon nitride.

3. The method of claim 2 wherein forming the memory cell etch stop comprises forming the memory cell etch stop wherein the memory cell etch stop primarily comprises silicon nitride.

4. The method of claim 1 further comprising:
    forming a covering layer overlying the capping layer, wherein;
    removing the portion of the capping layer comprises removing a portion of the covering layer to form a peak.

5. The method of claim 4 wherein forming the memory cell etch stop comprises forming the memory cell etch stop comprising a convex shape overlying the memory cell, wherein the convex shape is convex relative to the memory cell upper surface.

6. The method of claim 4 wherein forming the covering layer comprises forming the covering layer comprising silicon dioxide.

7. The method of claim 1 wherein forming the memory cell comprises:
    forming a pinning layer that is magnetic;
    forming a tunnel barrier layer overlying the pinning layer, wherein the tunnel barrier layer is an electrical insulator; and
    forming a free layer overlying the tunnel barrier layer, wherein the free layer is magnetic.

8. The method of claim 7 wherein forming the tunnel barrier layer comprises forming the tunnel barrier layer wherein the tunnel barrier layer comprises magnesium oxide.

9. The method of claim 1 wherein the interconnect is in direct electrical contact with the memory cell.

10. The method of claim 1 wherein:
    forming the capping layer comprises forming the capping layer in direct contact with the memory cell.

11. The method of claim 10 wherein:
    forming the memory cell etch stop comprises forming the memory cell etch stop in direct contact with the memory cell upper surface.

12. A method of producing an integrated circuit comprising:
    forming a memory cell comprising a memory cell upper surface;
    forming a memory cell etch stop with a convex shape overlying the memory cell, wherein the memory cell etch stop is convex to the memory cell upper surface;
    forming a memory dielectric layer overlying the memory cell etch stop;
    forming a via in the memory dielectric layer, wherein the memory cell etch stop is exposed in the via;
    removing at least a portion of the memory cell etch stop from within the via; and
    forming an interconnect within the via, wherein the interconnect is in electrical communication with the memory cell.

13. The method of claim 12 further comprising:
    forming a capping layer overlying the memory cell before forming the memory cell etch stop.

14. The method of claim 13 wherein:
    forming the memory cell etch stop comprises forming the memory cell etch stop such that the memory cell etch stop and the capping layer primarily comprise the same material.

15. The method of claim 13 further comprising:
    removing the capping layer from over the memory cell upper surface prior to forming the memory cell etch stop.

16. The method of claim 12 wherein removing the memory cell etch stop from within the via comprises exposing the memory cell upper surface within the via.

* * * * *